United States Patent
Shen et al.

(10) Patent No.: US 12,432,933 B2
(45) Date of Patent: Sep. 30, 2025

(54) SEMICONDUCTOR PACKAGES

(71) Applicant: Taiwan Semiconductor Manufacturing Company, Ltd., Hsinchu (TW)

(72) Inventors: Hsiang-Ku Shen, Hsinchu (TW); Ku-Feng Lin, New Taipei (TW); Liang-Wei Wang, Hsinchu (TW); Dian-Hau Chen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/596,625

(22) Filed: Mar. 6, 2024

(65) Prior Publication Data

US 2024/0215261 A1    Jun. 27, 2024

Related U.S. Application Data

(63) Continuation of application No. 17/362,936, filed on Jun. 29, 2021, now Pat. No. 11,950,432.

(60) Provisional application No. 63/156,943, filed on Mar. 5, 2021.

(51) Int. Cl.
| | |
|---|---|
| *H10B 61/00* | (2023.01) |
| *G11C 11/16* | (2006.01) |
| *H01L 23/522* | (2006.01) |
| *H01L 23/528* | (2006.01) |
| *H10N 50/01* | (2023.01) |
| *H10N 50/10* | (2023.01) |
| *H10N 50/80* | (2023.01) |

(52) U.S. Cl.
CPC ............ *H10B 61/22* (2023.02); *G11C 11/161* (2013.01); *H01L 23/5226* (2013.01); *H01L 23/5283* (2013.01); *H10N 50/01* (2023.02); *H10N 50/10* (2023.02); *H10N 50/80* (2023.02)

(58) Field of Classification Search
CPC ........ H10B 61/22; H10N 50/80; H10N 50/01; H10N 50/10; G11C 11/161; H01L 23/5226; H01L 23/5283
USPC ........................................................ 257/421
See application file for complete search history.

(56) References Cited

U.S. PATENT DOCUMENTS

| | | |
|---|---|---|
| 8,993,380 B2 | 3/2015 | Hou et al. |
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 | 8/2017 | Su et al. |
| 2022/0149002 A1* | 5/2022 | Hou .................. H01L 25/18 |

\* cited by examiner

*Primary Examiner* — Tu-Tu V Ho
(74) *Attorney, Agent, or Firm* — JCIPRNET

(57) ABSTRACT

A semiconductor package includes a first integrated circuit and a second integrated circuit. The first integrated circuit includes a first semiconductor substrate, a first bonding structure bonded to the second integrated circuit, a ferromagnetic layer surrounding the first bonding structure, and a memory cell between the first semiconductor substrate and the first bonding structure.

20 Claims, 17 Drawing Sheets

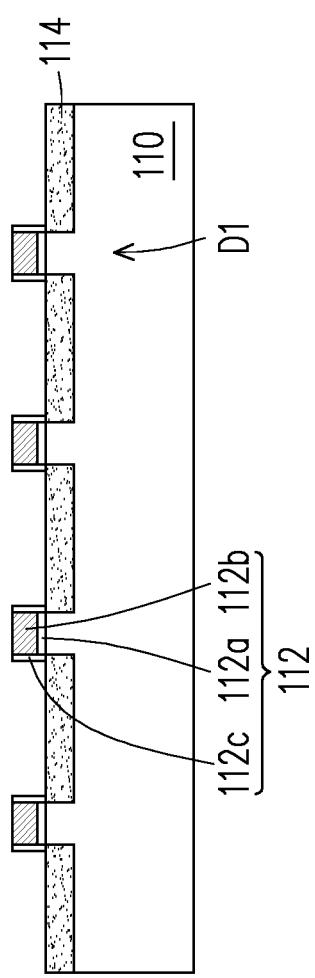

SEMICONDUCTOR PACKAGES

CROSS-REFERENCE TO RELATED APPLICATION

This application is a continuation application of and claims the priority benefit of a prior application Ser. No. 17/362,936, filed on Jun. 29, 2021 and now allowed, which claims the priority benefit of U.S. provisional application Ser. No. 63/156,943, filed on Mar. 5, 2021. The entirety of the above-mentioned patent application is hereby incorporated by reference herein and made a part of this specification.

BACKGROUND

Some integrated circuit manufacturing processes include manufacturing steps associated with making data storage circuit elements. Data storage elements such as Dynamic Random Access Memory (DRAM), Static Random Access Memory (SRAM) and flash memory (a form of non-volatile memory), place data storage circuit elements in an integrated circuit in tightly-packed arrays of elements, to minimize the amount of die area occupied by data storage elements. Magnetoresistive Random Access Memory (MRAM) is a type of data storage element in which information is stored based on the orientation of a magnetic field in a circuit element. MRAM uses the magnetic field to store information rather than the presence/absence of electrical charge in a storage circuit element, or with the quantity of electronic charge stored in a data storage circuit element.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A to FIG. 1F are schematic cross sectional views of various stages in a method of manufacturing a memory die according to some embodiments.

DETAILED DESCRIPTION

Figure 1B:
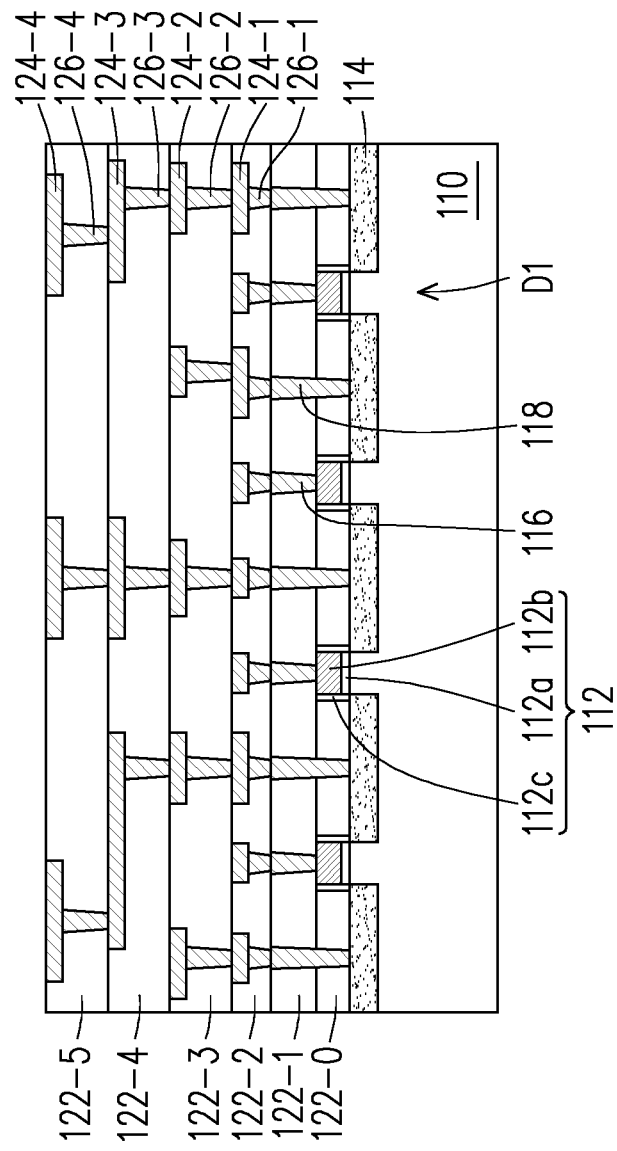

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1F are schematic cross sectional views of various stages in a method of manufacturing a memory die according to some embodiments.

Referring to FIG. 1A, a semiconductor substrate 110 is provided. In some embodiments, the semiconductor substrate 110 is a bulk semiconductor substrate. A "bulk" semiconductor substrate refers to a substrate that is entirely composed of at least one semiconductor material. In some embodiments, the bulk semiconductor substrate includes a semiconductor material or a stack of semiconductor materials such as silicon (Si), germanium (Ge), silicon germanium (SiGe), carbon doped silicon (Si:C), silicon germanium carbon (SiGeC); or an III-V compound semiconductor such as gallium arsenide (GaAs), gallium phosphide (GaP), indium phosphide (InP), indium arsenide (InAs), indium antimonide (InSb), gallium arsenide phosphide (GaAsP), aluminum indium arsenide (AlInAs), aluminum gallium arsenide (AlGaAs), gallium indium arsenide (GaInAs), gallium indium phosphide (GaInP), or gallium indium arsenide phosphide (GaInAsP). In some embodiments, the bulk semiconductor substrate includes a single crystalline semiconductor material such as single crystalline silicon. In some embodiments, the bulk semiconductor substrate is doped depending on design requirements. In some embodiments, the bulk semiconductor substrate is doped with p-type dopants or n-type dopants. The term "p-type" refers to the addition of impurities to an intrinsic semiconductor that creates deficiencies of valence electrons. Exemplary p-type dopants, i.e., p-type impurities, include, but are not limited to, boron, aluminum, gallium, and indium. "N-type" refers to the addition of impurities that contribute free electrons to an intrinsic semiconductor. Exemplary n-type dopants, i.e., n-type impurities, include, but are not limited to, antimony, arsenic, and phosphorous. If doped, the semiconductor substrate 110, in some embodiments, has a dopant concentration in a range from $1.0 \times 10^{14}$ atoms/cm$^3$ to $1.0 \times 10^{17}$ atoms/cm$^3$, although the dopant concentrations may be greater or smaller. In some embodiments, the semiconductor substrate 110 is a semiconductor-on-insulator (SOI) substrate including a top semiconductor layer formed on an insulator layer (not shown). The top semiconductor layer includes the above-mentioned semiconductor material such as Si, Ge, SiGe, Si:C, SiGeC; or an III-V compound semiconductor including GaAs, GaP, InP, InAs, InSb, GaAsP, AlInAs, AlGaAs, GaInAs, GaInP, or GaInASP. The insulator layer is, for example, a silicon oxide layer, or the like. The insulator layer is provided over a base substrate, typically a silicon or glass substrate.

Then, a plurality of active devices D1 may be formed in and over the semiconductor substrate 110. In some embodiments, a plurality of isolation structures (not shown) are formed in the semiconductor substrate 110 to define an active area where the active devices D1 are to be formed. The active devices D1 may be transistors such as FinFETs, MOSFETs, GAA nanowire FETs, GAA nanosheet FETs or the like. In some embodiments, the active devices D1 includes gate structures 112 over the semiconductor substrate 110 and source/drain regions 114 in the semiconductor substrate 110. The source/drain regions 114 are doped regions disposed at opposite sides of the gate structures 112 respectively. The gate structure 112 may include a gate dielectric layer 112a, a gate electrode 112b on the gate dielectric layer 112a and spacers 112c on opposite sidewalls of the gate dielectric layer 112a and the gate electrode 112b. In some embodiments, the gate dielectric layer 112a includes an oxide, a metal oxide, the like, or combinations thereof. The gate electrode 112b may include a metal-containing material such as titanium nitride, titanium oxide, tantalum nitride, tantalum carbide, cobalt, ruthenium, aluminum, tungsten, combinations thereof, or multi-layers thereof.

Figure 1C:
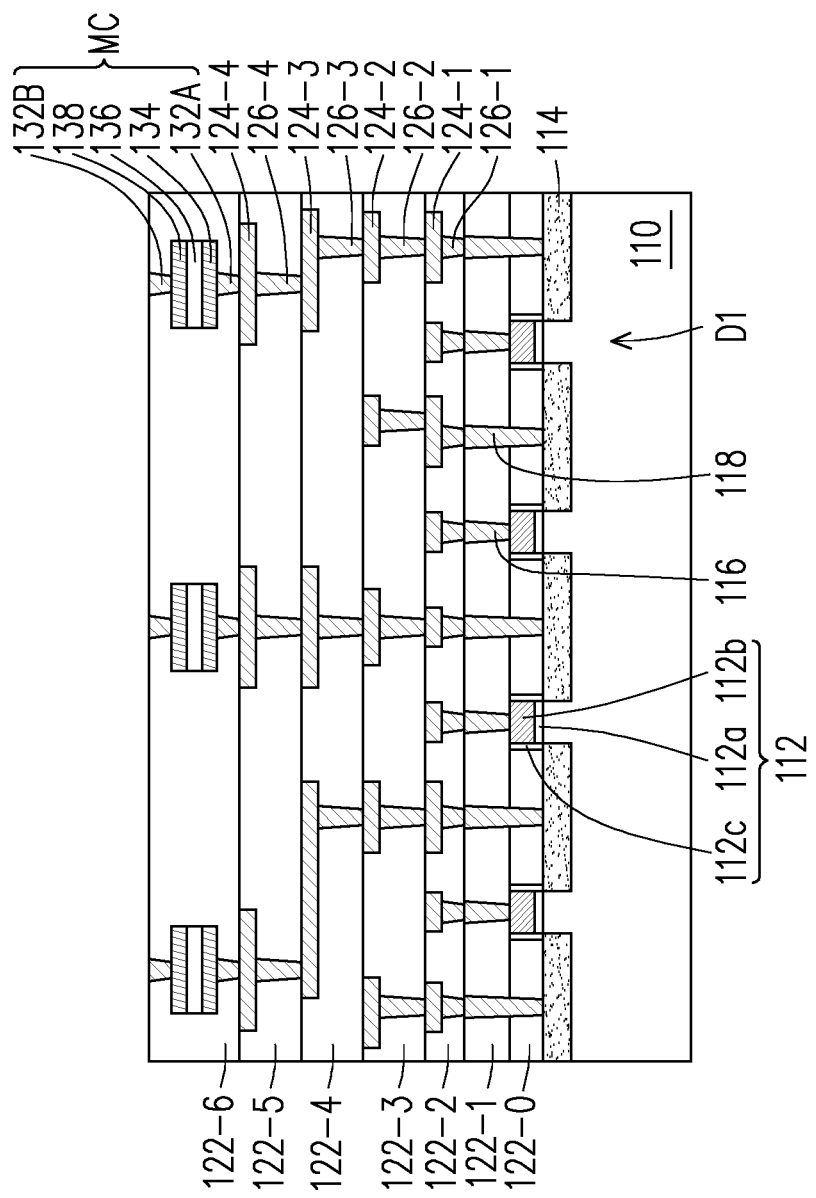
Figure 1D:
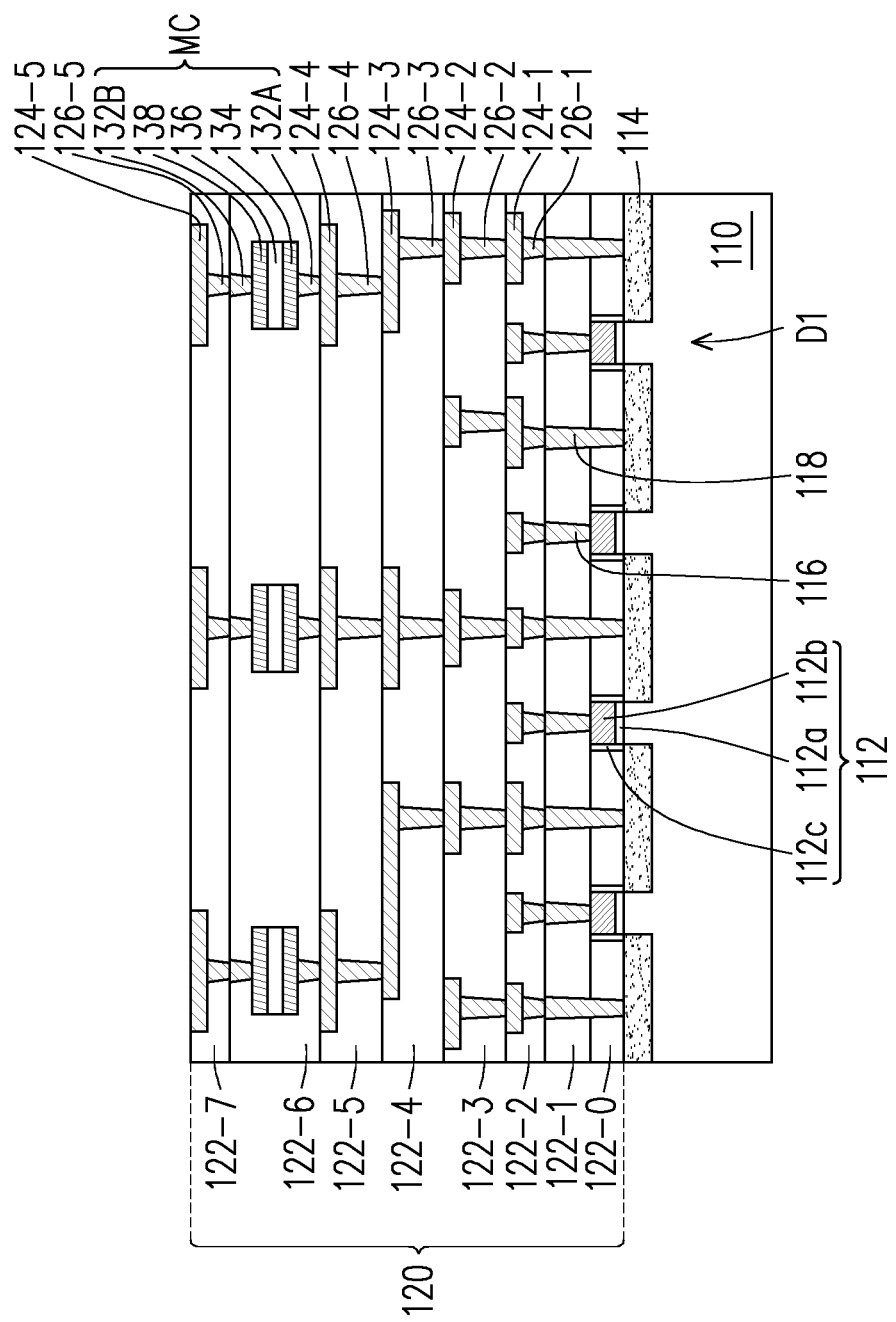

Referring to FIG. 1B to 1D, an interconnect structure 120 and memory cells MC are formed over the semiconductor substrate 110. The interconnect structure 120 (as shown in FIG. 1D) may include a plurality of dielectric layers 122-0, 122-1, 122-2, 122-3, 122-4, 122-5, 122-6, 122-7, a plurality of interconnect wirings 124-1, 124-2, 124-3, 124-4, 124-5 and a plurality of conductive vias 126-1, 126-2, 126-3, 126-4, 126-5 interconnecting the interconnect wirings 124-1, 124-2, 124-3, 124-4, 124-5. In some embodiments, portions of the interconnect structure 120 are formed before the formation of memory cells MC while remaining portions of the interconnect structure 120 are formed after the formation of the memory cells MC. First, as shown in FIG. 1B, after forming the source/drain regions 114 and the gate structures 112 of the active devices D1, a dielectric layer 122-0 is formed over the semiconductor substrate 110. In some embodiments, the dielectric layer 122-0 includes silicon oxide. Alternatively, in some embodiments, the dielectric layers 122-0 includes a low-k dielectric material having a dielectric constant (k) less than 4. In some embodiments, the low-k dielectric material has a dielectric constant from about 1.2 to about 3.5. In some embodiments, the dielectric layer 122-0 includes TEOS formed oxide, undoped silicate glass, or doped silicate glass such as BPSG, FSG, PSG, BSG, and/or other suitable dielectric materials. In some embodiments, the dielectric layer 122-0 is deposited by CVD, PECVD, PVD, spin coating, the like, or a combination thereof. In some embodiments, the dielectric layer 122-0 is deposited to have a top surface above the top surface of the gate structures 112. The dielectric layer 122-0 is subsequently planarized, for example, by CMP and/or a recess etch using the gate structures 112 as a polishing and/or etch stop. After the planarization, the dielectric layer 122-0 has a surface substantially coplanar with the top surface of the gate structures 112. In some embodiments, the gate structure 112 is formed by a gate-first process. However, the disclosure is not limited thereto. In alternative embodiments, the gate structure 112 is formed by a gate-last process, and the replacement process is performed after forming the dielectric layer 122-0. In some embodiments, top surfaces of the gate electrode 112b, the spacers 112c and the dielectric layer 122-0 are substantially coplanar.

In some embodiments, after forming the dielectric layer 122-0, a dielectric layer 122-1 is formed to cover the dielectric layer 122-0. In some embodiments, the dielectric layer 122-1 includes silicon oxide. Alternatively, in some embodiments, the dielectric layer 122-1 includes a low-k dielectric material having a dielectric constant (k) less than 4. In some embodiments, the low-k dielectric material has a dielectric constant from about 1.2 to about 3.5. In some embodiments, the dielectric layer 122-1 includes TEOS formed oxide, undoped silicate glass, or doped silicate glass such as BPSG, FSG, PSG, BSG, and/or other suitable dielectric materials. In some embodiments, the dielectric layer 122-1 is formed by CVD, PECVD, PVD, spin coating, the like, or a combination thereof. In some embodiments, the dielectric layer 122-0 and the dielectric layer 122-1 are patterned to form openings for exposing portions of the source/drain regions 114 and the gate structures 112. Then, a conductive material is formed to fill the opening defined in the dielectric layer 122-0 and the dielectric layer 122-1. An optional diffusion barrier and/or optional adhesion layer may be deposited in the openings before filled with the conductive material. Suitable materials for the barrier layer include titanium, titanium nitride, titanium oxide, tantalum, tantalum nitride, titanium oxide, combinations thereof, or the like, and suitable materials for the conductive material include copper, silver, gold, tungsten, aluminum, combinations thereof, or the like. A chemical mechanical planarization (CMP) process or the like may be used to remove excess conductive material, so as to form a gate contact 116 and source/drain contacts 118. In some embodiments, the gate contact 116 is in contact with the gate structure 112, the source/drain contacts 118 is in contact with the source/drain regions 114. A material of the gate contact 116 and the source/drain contacts 118 may include aluminum, titanium, copper, nickel, tungsten, and/or alloys thereof. The gate contact 116 and the source/drain contacts 118 may be formed by electroplating, deposition, the like or a combination thereof. In an embodiment, the gate contact 116 and the source/drain contacts 118 may be formed by depositing a seed layer of copper or a copper alloy, and filling the openings by electroplating.

Then, the dielectric layers 122-2, 122-3, 122-4, 122-5, the interconnect wirings 124-1, 124-2, 124-3, 124-4 and the conductive vias 126-1, 126-2, 126-3, 126-4 interconnecting the interconnect wirings 124-1, 124-2, 124-3, 124-4 are formed over the dielectric layers 122-1, for example. Each of the stacked dielectric layers 122-2, 122-3, 122-4, 122-5 may include a dielectric material, such as a low-k dielectric material, an extra low-k (ELK) dielectric material, or the like. The dielectric layers 122-2, 122-3, 122-4, 122-5 may be deposited using an appropriate process, such as, CVD, ALD, PVD, PECVD, or the like.

In some embodiments, the interconnect wirings 124-1, 124-2, 124-3, 124-4 is also referred to as routings, conductive patterns, conductive features or conductive lines. In some embodiments, the interconnect wirings 124-1, 124-2, 124-3, 124-4 and the conductive vias 126-1, 126-2, 126-3, 126-4 are formed using a damascene process or a dual-damascene process. For example, a respective dielectric layer 122-2, 122-3, 122-4, 122-5 is patterned utilizing a combination of photolithography and etching techniques to form trenches corresponding to the desired pattern of t the interconnect wirings 124-1, 124-2, 124-3, 124-4 and the conductive vias 126-1, 126-2, 126-3, 126-4. An optional diffusion barrier and/or optional adhesion layer may be deposited and the trenches may then be filled with a conductive material. Suitable materials for the barrier layer include titanium, titanium nitride, titanium oxide, tantalum, tantalum nitride, titanium oxide, combinations thereof, or the like, and suitable materials for the conductive material include copper, silver, gold, tungsten, aluminum, combinations thereof, or the like. In an embodiment, the interconnect wirings 124-1, 124-2, 124-3, 124-4 and the conductive vias 126-1, 126-2, 126-3, 126-4 are formed by depositing a seed layer of copper or a copper alloy, and filling the trenches by electroplating. A chemical mechanical planarization (CMP) process or the like may be used to remove excess conductive material from a surface of the respective dielectric layer 122-2, 122-3, 122-4, 122-5 and to planarize surfaces of the dielectric layer 122-2, 122-3, 122-4, 122-5 and the interconnect wirings 124-1, 124-2, 124-3, 124-4 and the conductive vias 126-1, 126-2, 126-3, 126-4 for subsequent processing.

Referring to FIG. 1C, the memory cells MC are formed over the formed portions of the interconnect structure 120. For example, after forming the interconnect wirings 124-4 of the interconnect structure 120, the memory cells MC are formed on and in contact with the interconnect wirings 124-4. In some embodiments, the memory cells MC are formed in a dielectric layer 122-6. The memory cells MC may be arranged in array. In some embodiments, the memory cell MC is a magnetic tunnel junction (MTJ) memory cell such as a MRAM cell. In some embodiments, the memory die 100 is also referred to as a MRAM die. In some embodiments, the memory cell MC includes a bottom electrode via 132A, a bottom electrode 134, a magnetic tunnel junction structure 136, a top electrode 138 and a top electrode via 132B. The bottom electrode 134 and the top electrode 138 may respectively include TiN, TaN, WN, W, Cu, Al, Ti, Ta, Ru, Co, Mo, Pt, an alloy thereof, and/or a combination thereof. Each magnetic tunnel junction structure 136 may include a synthetic antiferromagnet (SAF) structure (not shown), a nonmagnetic tunnel barrier layer (not shown), and a free magnetization layer (not shown). A nonmagnetic metallic buffer layer may be provided between the bottom electrode 134 and the magnetic tunnel junction 136. In alternative embodiments, in order to provide a flat surface for the elements (such as interconnect wirings 124-5, discussed below with respect to FIG. 1D) to be formed over the memory cells MC, at least one of the bottom electrode via 132A and the top electrode via 132B is omitted, or a conductive via is further formed under the bottom electrode via 132A or over the top electrode via 132B.

Referring to FIG. 1D, the remaining portions of the interconnect structure 120 are formed over the memory cells MC. In some embodiments, after forming the memory cells MC, the dielectric layers 122-7, the interconnect wirings 124-5 and the conductive vias 126-5 interconnecting the interconnect wirings 124-4 and 124-5 are formed over the dielectric layers 122-6, for example. The fabrication process of the dielectric layers 122-7, the interconnect wirings 124-5 and the conductive vias 126-5 is similar with the fabrication process of the dielectric layers 122-2, 122-3, 122-4, 122-5, the interconnect wirings 124-1, 124-2, 124-3, 124-4 and the conductive vias 126-1, 126-2, 126-3, 126-4. Detailed description related to the fabrication process is thus omitted.

In some embodiments, the memory cell MC is electrically connected to a bit line through the interconnect wirings such as the interconnect wirings 124-5, a source region of the source/drain region 114 is electrically connected to a source line through the interconnect wirings such as the interconnect wirings 124-1 and 124-2 and the source/drain contacts 118, and the gate structure 112 is electrically connected to a word line through the interconnect wirings such as the interconnect wirings 124-1 and the gate contacts 116. However, the disclosure is not limited thereto. Furthermore, an extending direction of the bit line may be substantially perpendicular to an extending direction of the word line. It is noted that the number of the dielectric layers and the interconnect wirings and the embedded locations of the memory cells MC are not limited in the present invention.

Figure 1E:
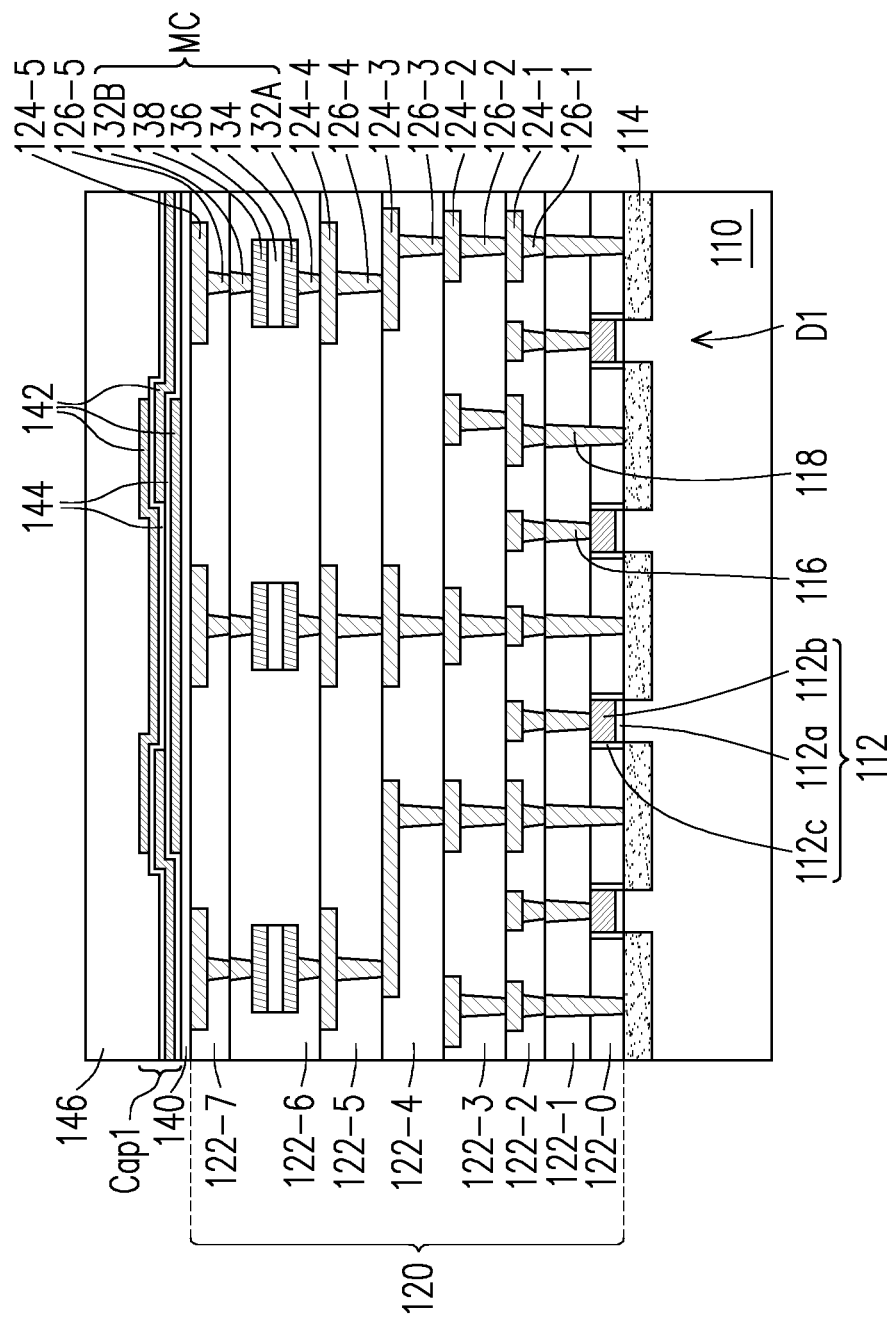

Referring to FIG. 1E, in some embodiments, a capacitor structure Cap1 is formed over the memory cells MC. The capacitor Cap1 may be a plate capacitor such as metal-insulator-metal (MIM) capacitor and includes a plurality of alternating conductive layers 142 and dielectric layers 144. The capacitance is formed between. For example, a dielectric layer 140 is formed over the dielectric layers 122-7. Then, the conductive layers 142 and dielectric layers 144 are alternately formed over the dielectric layer 140. In some embodiments, an entirety of the conductive layers 142 substantially covers an entire surface of the dielectric layer 140, so as to fully cover the memory cells MC. After that, a dielectric layer 146 may be formed to cover the capacitor structure Cap1. In some embodiments, the conductive layers 142 include one or more ferromagnetic elements such as cobalt (Co), nickel (Ni), iron (Fe) and a combination thereof (e.g., CoNi, CoFe, NiFe and CoNiFe). In an embodiment, the conductive layers 142 are made of cobalt. The dielectric layer 140, the dielectric layers 144 and the dielectric layer 146 may include silicon-containing dielectric material such as silicon oxide, silicon nitride, high-k dielectrics such as aluminum oxide ($Al_2O_3$), hafnium oxide ($HfO_2$), silicon dioxide ($SiO_2$), silicon carbide (SiC), silicon nitride (SiN or $Si_3N_4$), tantalum pentoxide ($Ta_2O_5$), tantalum oxynitride (TaON), tantalum dioxide ($TiO_2$), zirconium dioxide ($ZrO_2$), tetraethosiloxane (TEOS), spin-on-glass ("SOG"), halogenated SiO, fluorinated silicate glass ("FSG"), and the like. The dielectric layer 140, the dielectric layers 144 and the dielectric layer 146 may be deposited by atomic layer deposition (ALD), CVD, high-density plasma chemical vapor deposition (HDPCVD), PVD, the like, or a combination thereof.

Figure 1F:
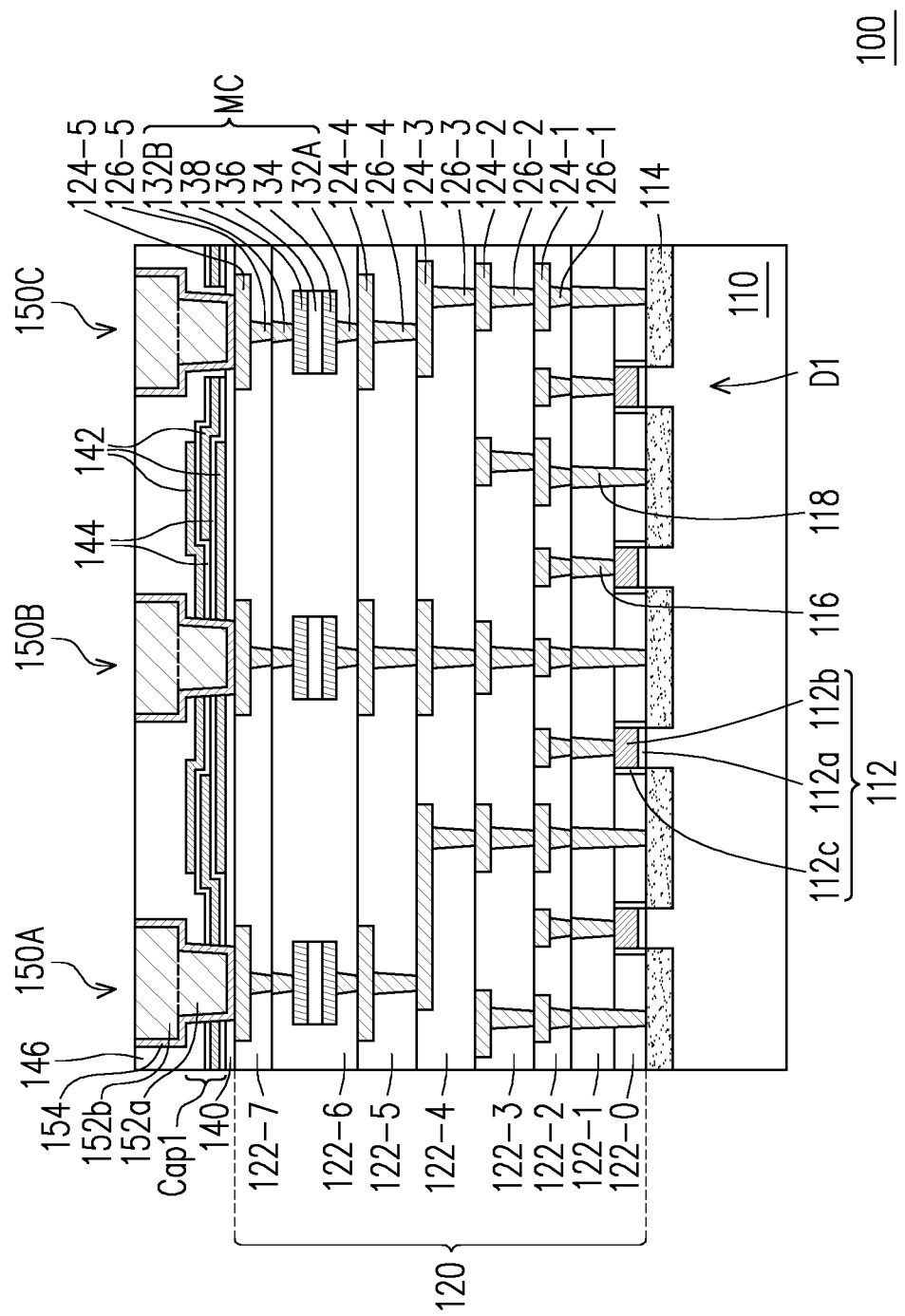
Figure 1G:
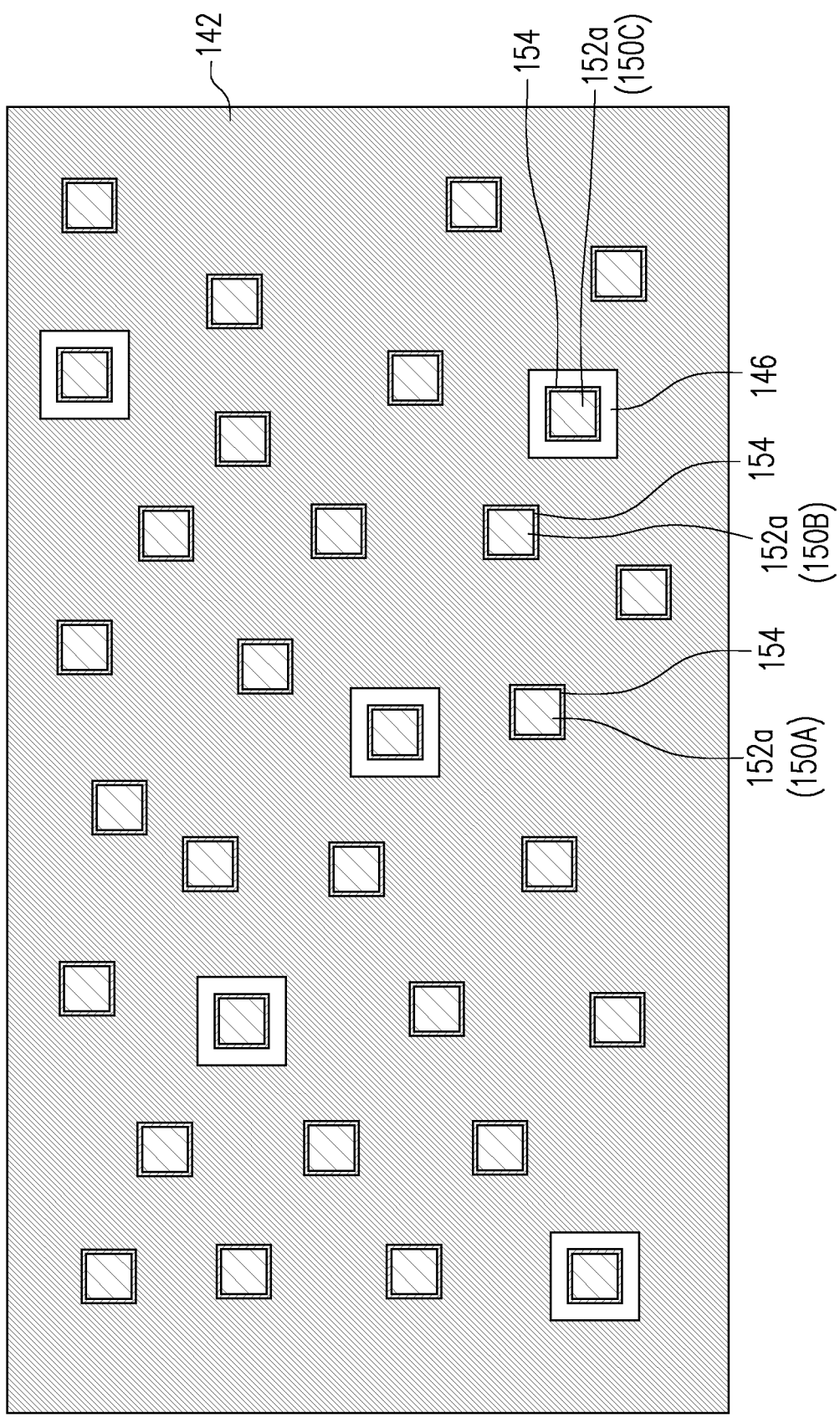
FIG. 1G is a schematic top view of a memory die of FIG. 1F according to some embodiments.

FIG. 1G is a schematic top view of a memory die of FIG. 1F according to some embodiments, in FIG. 1G, the bonding pad is omitted for clarity. Referring to FIG. 1F and FIG. 1G, a plurality of bonding structures 150A, 150B, 150C are formed over the interconnect structure 120. In some embodiments, after forming the bonding structures 150A, 150B, 150C, a memory die 100 is formed. The bonding structure 150A, 150B, 150C are electrically connected to the interconnect structure 120 and the memory cells MC. In some embodiments, the bonding structures 150A, 150B, 150C are formed in the dielectric layer 146 to electrically connect the interconnect wirings such as the interconnect wirings 124-5. In addition, based on the requirements, the bonding structures 150A, 150B may be further electrically connected to at least one of the conductive layers 142 of the capacitor structure Cap1. For example, the bonding structure 150A is electrically connected to one of the conductive layers 142, and the bonding structure 150B is electrically connected to two of the conductive layers 142. Accordingly, the bonding structures 150A, 150B may be disposed in the dielectric layer 146, the dielectric layer 140, at least one of the conductive layers 142 and at least one of the dielectric layers 144. In some embodiments, the bonding structure 150C is electrically isolated from the conductive layers 142 through the dielectric layer 146. However, the disclosure is not limited thereto. In alternative embodiments, all of the bonding structures are electrically connected to the conductive layers 142 of the capacitor structure Cap1.

In some embodiments, the bonding structure 150A, 150B, 150C include a bonding via 152a and a bonding pad 152b on the bonding via 152a. In some embodiments, top surfaces of the bonding structures 150A, 150B, 150C are substantially flush with a top surface of the dielectric layer 146. For example, top surfaces of the bonding pads 152b are substantially flush with a top surface of the dielectric layer 146. In some embodiments, the bonding structure 150A, 150B, 150C includes copper, tungsten, aluminum, silver, gold, the like, or a combination thereof. The bonding structure 150A, 150B, 150C may be formed by a dual damascene process or a single damascene process using an electro-chemical plating process, CVD, ALD, PVD, the like, or a combination thereof. In some embodiments, a liner layer 154 is further formed on sidewalls and a bottom of the bonding structure 150A, 150B, 150C. The bonding structure 150A, 150B are electrically connected to the conductive layer 142 through the liner layer 154, for example. In some embodiments, a material of the liner layer 154 includes one or more ferromagnetic elements such as cobalt (Co), nickel (Ni), iron (Fe) and a combination thereof (e.g., CoNi, CoFe, NiFe and CoNiFe). In some embodiments, the liner layer 154 and the conductive layers 142 of the capacitor structure Cap1 include ferromagnetic elements, and thus the liner layer 154 and the conductive layers 142 cooperatively function as a magnetic shielding layer for MRAM cells. For example, a total projection of the liner layer 154 and the conductive layers 142 onto the semiconductor substrate 110 is substantially overlapped with the entire semiconductor substrate 110. In an embodiment, the material of the liner layer 154 is substantially the same as the conductive layers 142 of the capacitor structure Cap1. In alternative embodiments, the liner layer 154 is omitted. In such embodiments, the bonding via 152a is in direct contact with at least one of the conductive layers 142.

In some embodiments, the memory die 100 is formed with the capacitor structure Cap1. Thus, as shown in FIG. 3B, when the memory die 100 is then bonded to a circuit structure 300, the capacitor structure Cap1 may avoid current resistance drop, voltage fluctuation and noise on the power supply network of the circuit structure 300. Additionally, in some embodiments in which the memory cells are MRAM cells, the conductive layers 142 of the capacitor structure Cap1 include ferromagnetic elements and substantially entirely cover the memory cells MC therebelow, and thus the conductive layers 142 function as a magnetic shielding layer for MRAM cells.

In some embodiments, the memory die 100 includes the semiconductor substrate 110, the active devices D1 in and/or over the semiconductor substrate 110, the interconnect structure 120 over the semiconductor substrate 110, the memory cells MC embedded in the interconnect structure 120 and the bonding structure 150A, 150B, 150C over the interconnect structure 120. In some embodiments, the memory die 100 is free of controlling circuit for the memory cells MC, in other words, the memory cells MC are unable to be operated by the circuit in the memory die 100 itself.

FIG. 2A to FIG. 2D are schematic cross sectional views of various stages in a method of manufacturing a peripheral circuit die according to some embodiments.

Figure 2A:
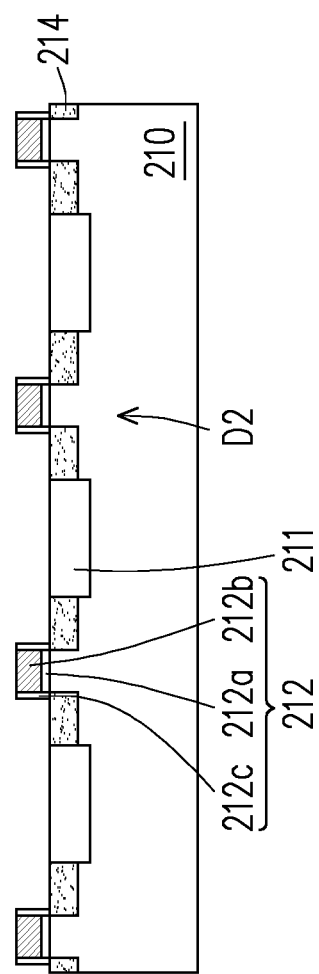
FIG. 2A to FIG. 2D are schematic cross sectional views of various stages in a method of manufacturing a peripheral circuit die according to some embodiments.

Referring to FIG. 2A, a semiconductor substrate 210 is provided. In some embodiments, the semiconductor substrate 210 may be a bulk semiconductor substrate. A "bulk" semiconductor substrate refers to a substrate that is entirely composed of at least one semiconductor material. In some embodiments, the bulk semiconductor substrate includes a semiconductor material or a stack of semiconductor materials such as silicon (Si), germanium (Ge), silicon germanium (SiGe), carbon doped silicon (Si:C), silicon germanium carbon (SiGeC); or an III-V compound semiconductor such as gallium arsenide (GaAs), gallium phosphide (GaP), indium phosphide (InP), indium arsenide (InAs), indium antimonide (InSb), gallium arsenide phosphide (GaAsP), aluminum indium arsenide (AlInAs), aluminum gallium arsenide (AlGaAs), gallium indium arsenide (GaInAs), gallium indium phosphide (GaInP), or gallium indium arsenide phosphide (GaInAsP). In some embodiments, the bulk semiconductor substrate includes a single crystalline semiconductor material such as single crystalline silicon. In some embodiments, the bulk semiconductor substrate is doped depending on design requirements. In some embodiments, the bulk semiconductor substrate is doped with p-type dopants or n-type dopants. The term "p-type" refers to the addition of impurities to an intrinsic semiconductor that creates deficiencies of valence electrons. Exemplary p-type dopants, i.e., p-type impurities, include, but are not limited to, boron, aluminum, gallium, and indium. "N-type" refers to the addition of impurities that contribute free electrons to an intrinsic semiconductor. Exemplary n-type dopants, i.e., n-type impurities, include, but are not limited to, antimony, arsenic, and phosphorous. If doped, the semiconductor substrate 210, in some embodiments, has a dopant concentration in a range from $1.0 \times 10^{14}$ atoms/cm$^3$ to $1.0 \times 10^{17}$ atoms/cm$^3$, although the dopant concentrations may be greater or smaller. In some embodiments, the semiconductor substrate 210 is a semiconductor-on-insulator (SOI) substrate including a top semiconductor layer formed on an insulator layer (not shown). The top semiconductor layer includes the above-mentioned semiconductor material such as Si, Ge, SiGe, Si:C, SiGeC; or an III-V compound semiconductor including GaAs, GaP, InP, InAs, InSb, GaAsP, AlInAs, AlGaAs, GaInAs, GaInP, or GaInASP. The insulator layer is, for example, a silicon oxide layer, or the like. The insulator layer is provided over a base substrate, typically a silicon or glass substrate.

Then, a plurality of active devices D2 may be formed in and over the semiconductor substrate 210. In some embodiments, a plurality of isolation structures 211 are formed in the semiconductor substrate 210 to define an active area where the active devices D2 are formed. The isolation structures 211 may be shallow trench isolation (STI) structures. In some embodiments, source/drain regions 214 and gate structures 212 of the active devices D2 may be formed over and/or in the semiconductor substrate 210. The active devices D2 may be transistors such as FinFETs, MOSFETs, GAA nanowire FETs, GAA nanosheet FETs or the like. In some embodiments, the active devices D2 includes source/drain regions 214 in the semiconductor substrate 210 and gate structures 212 over the semiconductor substrate 210.

The source/drain regions 214 are doped regions disposed at opposite sides of the gate structures 212 respectively. The gate structure 212 may include a gate dielectric layer 212a, a gate electrode 212b on the gate dielectric layer 212a and spacers 212c on opposite sidewalls of the gate dielectric layer 212a and the gate electrode 212b. In some embodiments, the gate dielectric layer 212a includes an oxide, a metal oxide, the like, or combinations thereof. The gate electrode 212b may include a metal-containing material such as titanium nitride, titanium oxide, tantalum nitride, tantalum carbide, cobalt, ruthenium, aluminum, tungsten, combinations thereof, or multi-layers thereof.

Figure 2B:
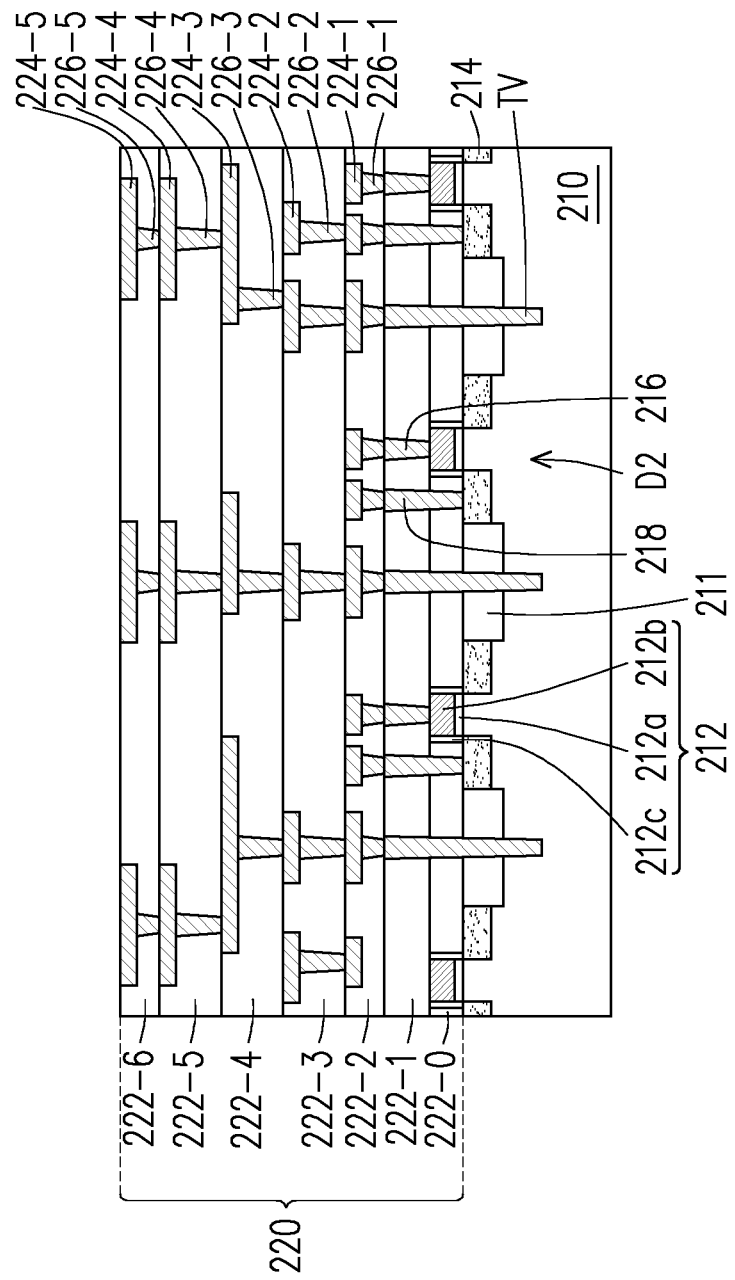

Referring to FIG. 2B, a peripheral circuit 220 is formed over the semiconductor substrate 210 and electrically connected to the active devices D2. In some embodiments, the peripheral circuit 220 includes a plurality of dielectric layers 222-0, 222-1, 222-2, 222-3, 222-4, 222-5, 222-6 and a gate contact 216, source/drain contacts 218, a plurality of conductive lines 224-1, 224-2, 224-3, 224-4, 224-5 and a plurality of conductive vias 226-1, 226-2, 226-3, 226-4, 226-5 in the dielectric layers 222-0, 222-1, 222-2, 222-3, 222-4, 222-5, 222-6. The fabrication process of the dielectric layers 222-0, 222-1, 222-2, 222-3, 222-4, 222-5, 222-6, the gate contact 216, the source/drain contacts 218, the conductive lines 224-1, 224-2, 224-3, 224-4, 224-5 and the conductive vias 226-1, 226-2, 226-3, 226-4, 226-5 is similar with the fabrication process of the dielectric layers 122-0, 122-1, 122-2, 122-3, 122-4, 122-5, 122-6, 122-7, the interconnect wirings 124-1, 124-2, 124-3, 124-4, 124-5 and the conductive vias 126-1, 126-2, 126-3, 126-4, 124-5. Detailed description related to the fabrication process is thus omitted. In some embodiments, the linewidth of the conductive lines 224-1, 224-2, 224-3, 224-4, 224-5 is larger than 40 μm. For example, the linewidth of the conductive lines 224-1, 224-2, 224-3, 224-4, 224-5 is in a range of about 40 μm to about 1100 μm.

In some embodiments, the through vias TV are further formed in the dielectric layer 222-0, the dielectric layer 222-1, the isolation structures 211 and the semiconductor substrate 210. For example, via openings are formed in the dielectric layer 222-0, the dielectric layer 222-1, the isolation structures 211 and the semiconductor substrate 210. Then, a conductive material is formed to fill the via openings. An optional diffusion barrier and/or optional adhesion layer may be deposited in the via openings before filled with the conductive material. Suitable materials for the barrier layer include titanium, titanium nitride, titanium oxide, tantalum, tantalum nitride, titanium oxide, combinations thereof, or the like, and suitable materials for the conductive material include aluminum, titanium, copper, nickel, tungsten, and/or alloys thereof. A chemical mechanical planarization (CMP) process or the like may be used to remove excess conductive material, so as to form the though vias TV. The though vias TV may be formed by electroplating, deposition, the like or a combination thereof.

In some embodiments, the through vias TV are formed in the semiconductor substrate 210 and isolated from the source/drain regions 214 by the isolation structures 211. In some embodiments, the through vias TV are disposed in the semiconductor substrate 210 without penetrating an entire thickness of the semiconductor substrate 210. In other words, the through vias TV may be not exposed. For example, top surfaces of the through vias TV are substantially coplanar with a top surface of the semiconductor substrate 210 while bottom surfaces of the through vias TV are higher than a bottom surface of the semiconductor substrate 210.

In some embodiments, the peripheral circuit 220 is electrically connected to the source/drain regions 214 and the gate structures 212 through the gate contacts 216 and the source/drain contacts 218. In some embodiments, the peripheral circuit 220 is electrically connected to the through vias TV. The peripheral circuit 220 may have function for detecting states in the memory cells MC of the memory die 100, controlling the memory cells MC of the memory die 100, and input/output operations. Thus, the peripheral circuit 220 may operate the memory cells (such as the memory cells MC) once the peripheral circuit 220 is electrically connected to the memory cells.

Figure 2C:
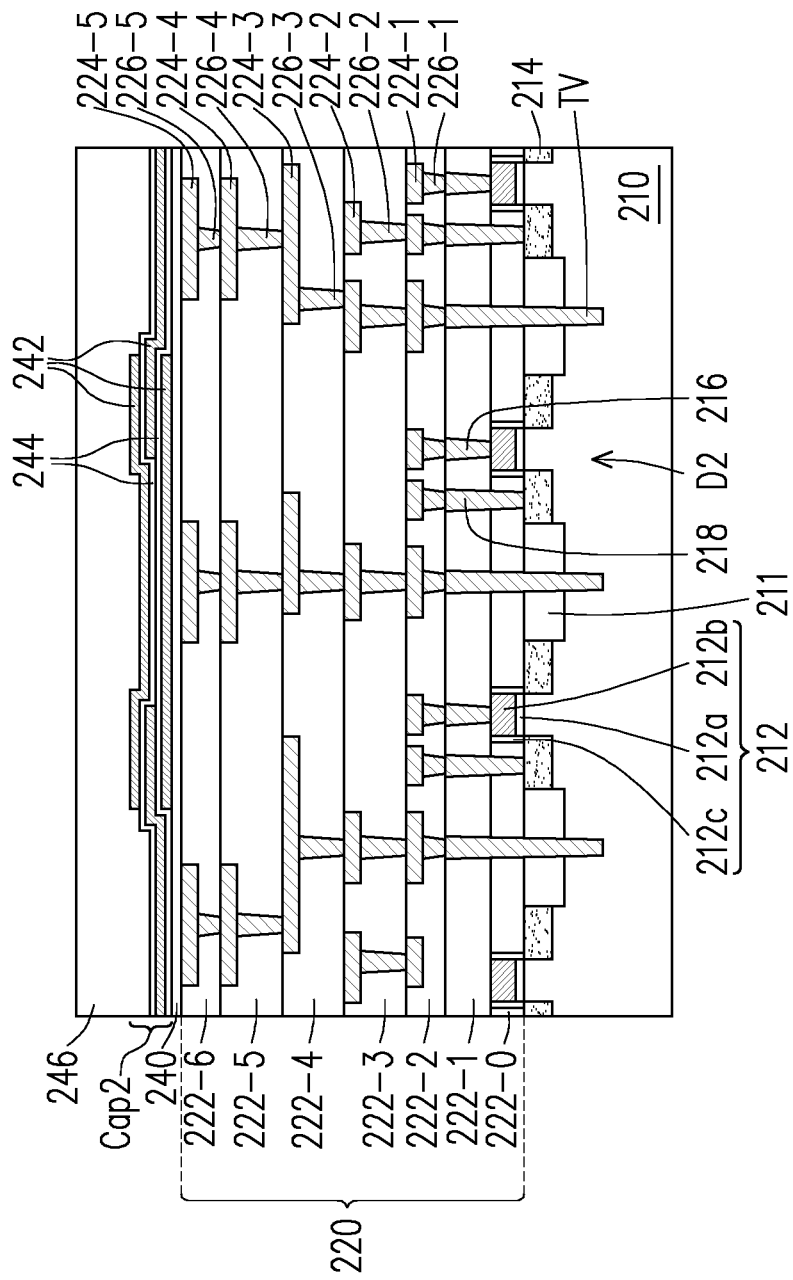

Referring to FIG. 2C, in some embodiments, a capacitor structure Cap2 is formed over the peripheral circuit 220. The capacitor Cap2 may be a plate capacitor such as metal-insulator-metal (MIM) capacitor and includes a plurality of alternating conductive layers 242 and dielectric layers 244. For example, a dielectric layer 240 is formed over the dielectric layers 222-6. Then, the conductive layers 242 and dielectric layers 244 are alternately formed over the dielectric layer 240. In some embodiments, an entirety of the conductive layers 242 substantially covers an entire surface of the dielectric layer 240. After that, a dielectric layer 246 may be formed to cover the capacitor structure Cap2. In some embodiments, the conductive layers 242 include one or more ferromagnetic elements such as cobalt (Co), nickel (Ni), iron (Fe) and a combination thereof (e.g., CoNi, CoFe, NiFe and CoNiFe). In an embodiment, the conductive layers 242 are made of cobalt. The dielectric layer 240, the dielectric layers 244 and the dielectric layer 246 may include silicon-containing dielectric material such as silicon oxide, silicon nitride, high-k dielectrics such as aluminum oxide ($Al_2O_3$), hafnium oxide ($HfO_2$), silicon dioxide ($SiO_2$), silicon carbide (SiC), silicon nitride (SiN or $Si_3N_4$), tantalum pentoxide ($Ta_2O_5$), tantalum oxynitride (TaON), tantalum dioxide ($TiO_2$), zirconium dioxide ($ZrO_2$), tetraethosiloxane (TEOS), spin-on-glass ("SOG"), halogenated SiO, fluorinated silicate glass ("FSG"), and the like. The dielectric layer 240, the dielectric layers 244 and the dielectric layer 246 may be deposited by atomic layer deposition (ALD), CVD, high-density plasma chemical vapor deposition (HDPCVD), PVD, the like, or a combination thereof.

Figure 2D:
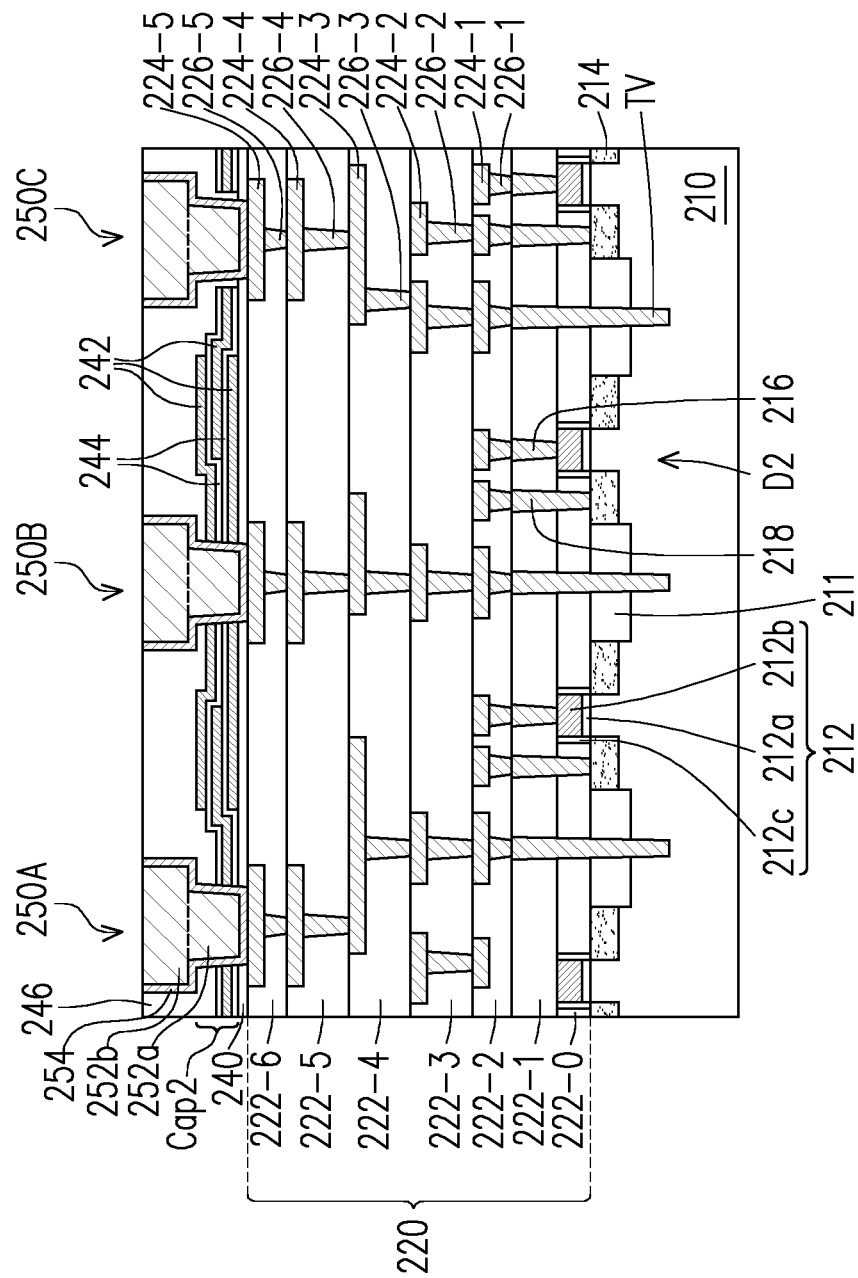
Figure 2E:
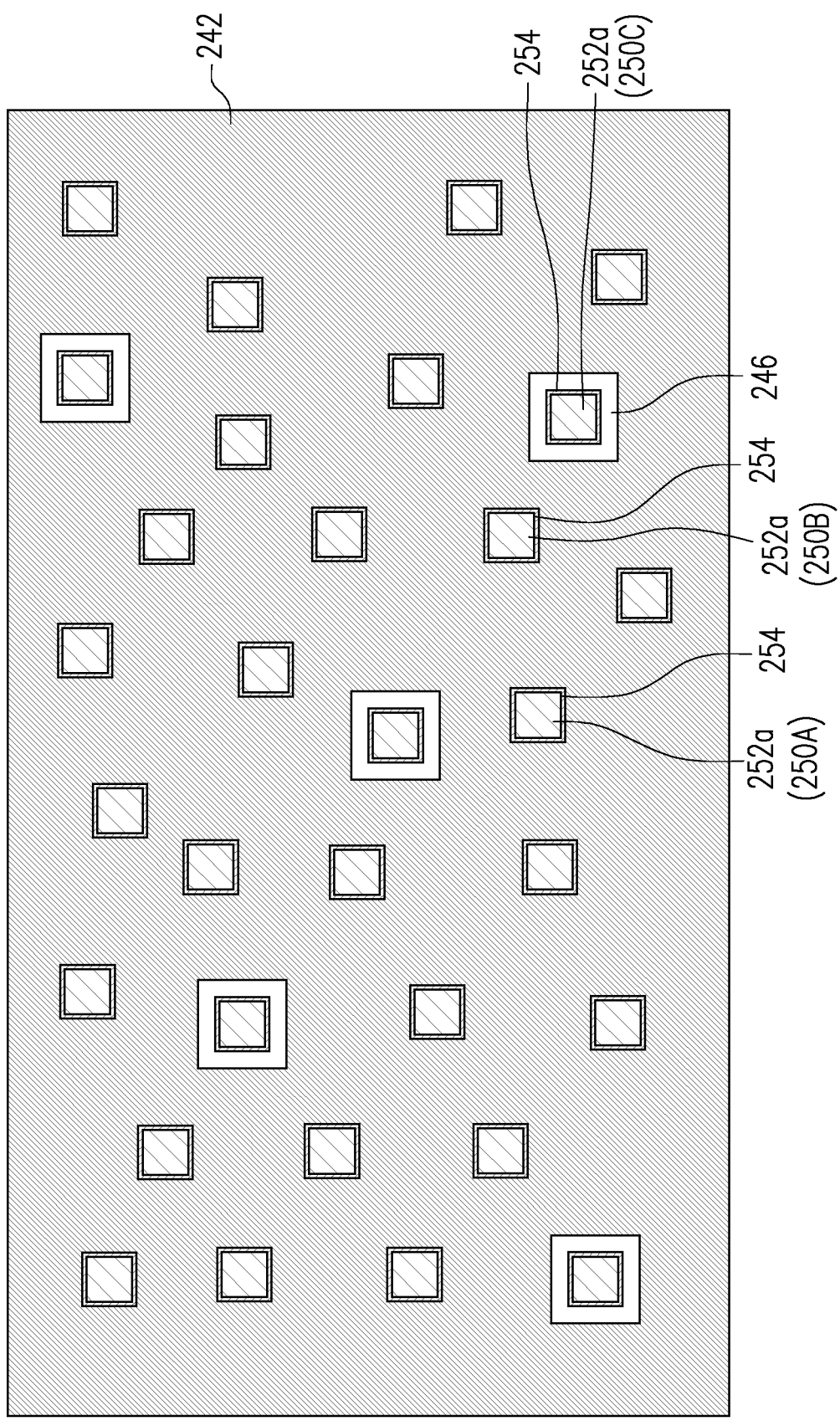
FIG. 2E is a schematic top view of a peripheral circuit die of FIG. 2D according to some embodiments.

FIG. 2E is a schematic top view of a peripheral circuit die of FIG. 2D according to some embodiments, in FIG. 2E, the bonding pad is omitted for clarity. Referring to FIG. 2D and FIG. 2E, a plurality of bonding structures 250A, 250B, 250C are formed over the periphery circuit 220. In some embodiments, after forming the bonding structures 250A, 250B, 250C, a peripheral circuit die 200 is formed. The bonding structure 250A, 250B, 250C are electrically connected to the periphery circuit 220. In some embodiments, the bonding structures 250A, 250B, 250C are formed in the dielectric layer 246 to electrically connect the conductive lines such as the conductive lines 224-5. In addition, based on the requirements, the bonding structures 250A, 250B may be further electrically connected to at least one of the conductive layers 242 of the capacitor structure Cap2. For example, the bonding structure 250A is electrically connected to one of the conductive layers 242, and the bonding structure 250B is electrically connected to two of the conductive layers 242. Accordingly, the bonding structures 250A, 250B may be disposed in the dielectric layer 246, the dielectric layer 240, at least one of the conductive layers 242 and at least one of the dielectric layers 244. In some embodiments, the bonding structure 250C is electrically isolated from the conductive layers 242 through the dielectric layer 246. However, the disclosure is not limited thereto. In alternative embodiments, all of the bonding structures are electrically connected to the conductive layers 242 of the capacitor structure Cap2.

In some embodiments, the bonding structure 250A, 250B, 250C include a bonding via 252a and a bonding pad 252b on the bonding via 252a. In some embodiments, top surfaces of the bonding structures 250A, 250B, 250C are substantially flush with a top surface of the dielectric layer 246. For example, top surfaces of the bonding pads 252b are substantially flush with a top surface of the dielectric layer 246. In some embodiments, the bonding structure 250A, 250B, 250C includes copper, tungsten, aluminum, silver, gold, the like, or a combination thereof. The bonding structure 250A, 250B, 250C may be formed by a dual damascene process or a single damascene process using an electro-chemical plating process, CVD, ALD, PVD, the like, or a combination thereof. In some embodiments, a liner layer 254 is further formed on sidewalls and a bottom of the bonding structure 250A, 250B, 250C. The bonding structure 250A, 250B are electrically connected to the conductive layer 142 through the liner layer 254, for example. In some embodiments, a material of the liner layer 254 includes one or more ferromagnetic elements such as cobalt (Co), nickel (Ni), iron (Fe) and a combination thereof (e.g., CoNi, CoFe, NiFe and CoNiFe). In some embodiments, the liner layer 254 and the conductive layers 242 of the capacitor structure Cap2 include ferromagnetic elements, and thus the liner layer 254 and the conductive layers 242 cooperatively function as a magnetic shielding layer for MRAM cells MC of the memory die 100 after bonding to the memory die 100. For example, a total projection of the liner layer 254 and the conductive layers 242 onto the semiconductor substrate 210 is substantially overlapped with the entire semiconductor substrate 210. In an embodiment, the material of the liner layer 254 is substantially the same as the conductive layers 142 of the capacitor structure Cap2. In alternative embodiments, the liner layer 254 is omitted. In such embodiments, the bonding via 252a is in direct contact with at least one of the conductive layers 242.

In some embodiments, the peripheral circuit die 200 is formed with the capacitor structure Cap2. Thus, as shown in FIG. 3B, when the peripheral circuit die 200 is then bonded to a circuit structure 300, the capacitor structure Cap2 may avoid current resistance drop, voltage fluctuation and noise on the power supply network of the circuit structure 300. Additionally, in some embodiments in which the memory die 100 to be bonded includes MRAM cells, the conductive layers 242 of the capacitor structure Cap2 include ferromagnetic elements and substantially entirely overlapped with the MRAM cells, and thus the conductive layers 242 function as a magnetic shielding layer for MRAM cells.

In some embodiments, the peripheral circuit die 200 includes the semiconductor substrate 210 having the through vias TV therein, the active devices D2 in and/or over the semiconductor substrate 210, the peripheral circuit 220 over the semiconductor substrate 210 and the bonding structures 250 over the peripheral circuit 220. In some embodiments, the capacitor structure Cap2 is further formed aside the bonding structures 250. In some embodiments, the peripheral circuit die 200 is free of memory devices (i.e., memory cells) such as MRAM.

Figure 3A:
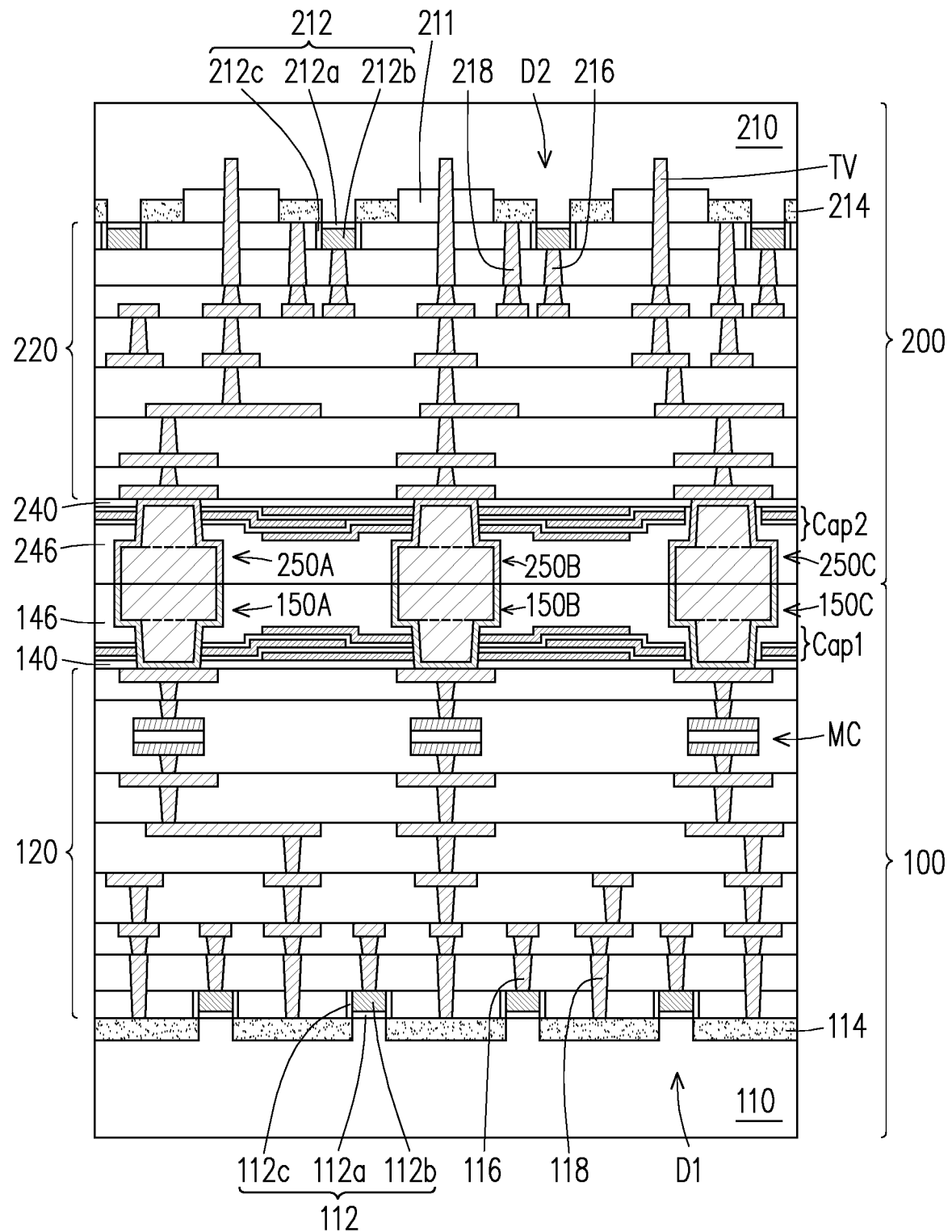
FIG. 3A and FIG. 3B are schematic cross sectional views of various stages in a method of manufacturing a semiconductor package according to some embodiments.
Figure 3B:
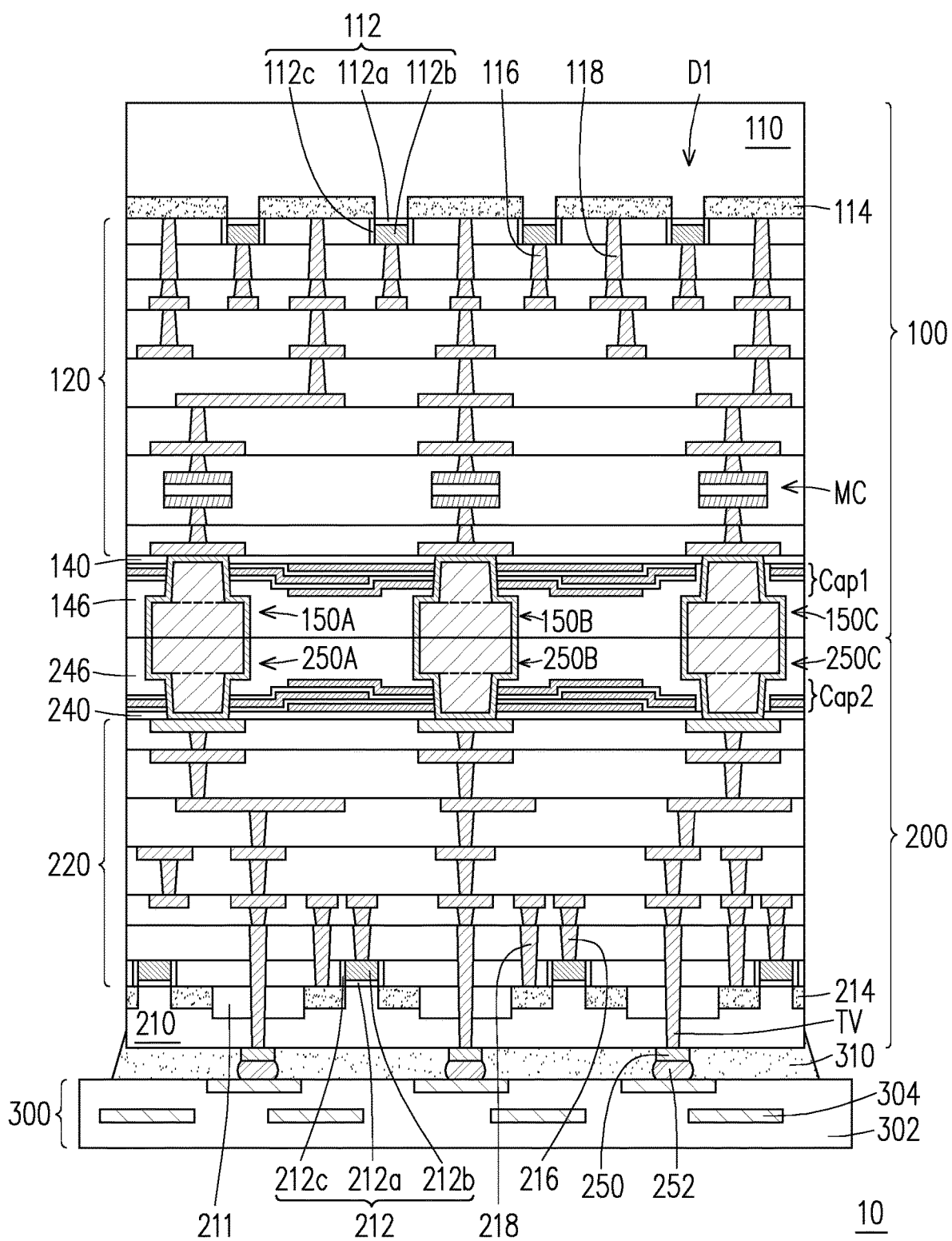

FIG. 3A and FIG. 3B are schematic cross sectional views of various stages in a method of manufacturing a semiconductor package according to some embodiments. In some embodiments, the semiconductor manufacturing method is part of a packaging process.

Referring to FIG. 3A, the memory die 100 of FIG. 1F and the peripheral circuit die 200 of FIG. 2D are bonded through the bonding structures 150A, 150B, 150C, 250A, 250B, 250C, so that the memory die 100 and the peripheral circuit die 200 are stacked. In some embodiments, the peripheral circuit die 200 has the same size (e.g., same surface area) with the memory die 100. For example, a sidewall of the peripheral circuit die 200 is substantially flush with a sidewall of the memory die 100. In alternative embodiments, the memory die 100 and the peripheral circuit die 200 have different sizes (e.g., surface areas). In some embodiments, the bonding structures 150A, 150B, 150C are bonded to the bonding structures 250A, 250B, 250C. In some embodiments, the bonding pads 152b are bonded to the bonding pads 252b respectively. In some embodiments, the dielectric layer 146 is further bonded to the dielectric layer 246. The bonding pads 152b may be in direct contact with the bonding pads 252b, and the dielectric layer 146 may be in direct contact with the dielectric layer 246. The memory die 100 and the peripheral circuit die 200 are bonded through a hybrid bonding including metal-to-metal bonding and dielectric-to-dielectric bonding, for example. In some embodiments, the dielectric layer 146 and the dielectric layer 246 are respectively include oxide such as silicon oxide, and a bonding between the dielectric layer 146 and the dielectric layer 246 is an oxide-to-oxide bonding. In such embodiments, the bonding temperature is lower than or substantially equal to 280° C. It is noted that although FIG. 3A illustrates that the same type of the bonding structures are bonded (for example, the bonding structure 150A and the bonding structure 250A are bonded to each other and they are of the same type which is electrically connected to the conductive layer 142, 242 of the capacitor structure Cap 1, Cap 2), the disclosure is not limited thereto.

In some embodiments, through bonding the bonding structures 150A, 150B, 150C and the bonding structures 250A, 250B, 250C, the memory die 100 is electrically connected to the peripheral circuit die 200. Accordingly, the peripheral circuit 220 is electrically connected to the memory cells MC, to detect states in the memory cells MC, control the memory cells MC of the memory die 100 and/or provide input/output operations. In other words, the memory die 100 is operated by the peripheral circuit die 200.

Referring to FIG. 3B, the memory die 100 and the peripheral circuit die 200 are mounted onto a circuit structure 300, to form a semiconductor package 10. In some embodiments, portions of the semiconductor substrate 210 of the peripheral circuit die 200 are removed to expose the through vias TV. In some embodiments, the semiconductor substrate 210 is partially removed by a planarization process such as CMP using the bottom surfaces of the through vias TV as a polishing and/or etch stop. After partial removal of the semiconductor substrate 210, the bottom surfaces of the through vias TV are substantially coplanar with the bottom surface of the semiconductor substrate 210. In some embodiments, after the through vias TV are exposed, a plurality of conductive pads 250 and a plurality of conductive terminals 252 are sequentially formed on the through vias TV respectively. In some embodiments, the conductive terminals 252 are solder balls, ball grid array (BGA) balls, or controlled collapse chip connection (C4) bumps. In some embodiments, the conductive terminals 252 are made of a conductive material with low resistivity, such as Sn, Pb, Ag, Cu, Ni, Bi, or an alloy thereof.

Then, the peripheral circuit die 200 with the memory die 100 thereon may be mounted onto the circuit structure 300 through the conductive terminals 252 therebetween. In some embodiments, the peripheral circuit 220 is vertically disposed between the memory cells MC and the circuit structure 300. The circuit structure 300 may provide the power supply and the power supply network connecting to the power supply for the memory die 100 and the peripheral circuit die 200. The circuit structure 300 may be a PCB, a package substrate, such as a build-up substrate including multilayer core therein, a laminate substrate including a plurality of laminated dielectric films, a high-layer-count (HLC) substrate or the like. The circuit structure 300 may include one or more dielectric or polymer layers 302 and respective conductive patterns 304 in the dielectric or polymer layers 302. The conductive patterns 304 may route electrical signals such as by using vias and/or traces. The conductive patterns 304 may include bonding pads at the outermost surface of the circuit structure 300. The circuit structure 300 may further include conductive terminals (not shown), such as solder balls, to allow the circuit structure 300 to be mounted to another device. In alternative embodiments, passive devices (e.g., surface mount devices (SMDs), not shown) are attached to the circuit structure 300 prior to mounting the memory die 100 and the peripheral circuit die 200 on the circuit structure 300. In some embodiments, after bonding the memory die 100 and the peripheral circuit die 200 onto the circuit structure 300, an underfill 310 is formed between the peripheral circuit die 200 and the circuit structure 300, surrounding the conductive terminals 252. The underfill 310 may be formed by a capillary flow process.

Figure 4:
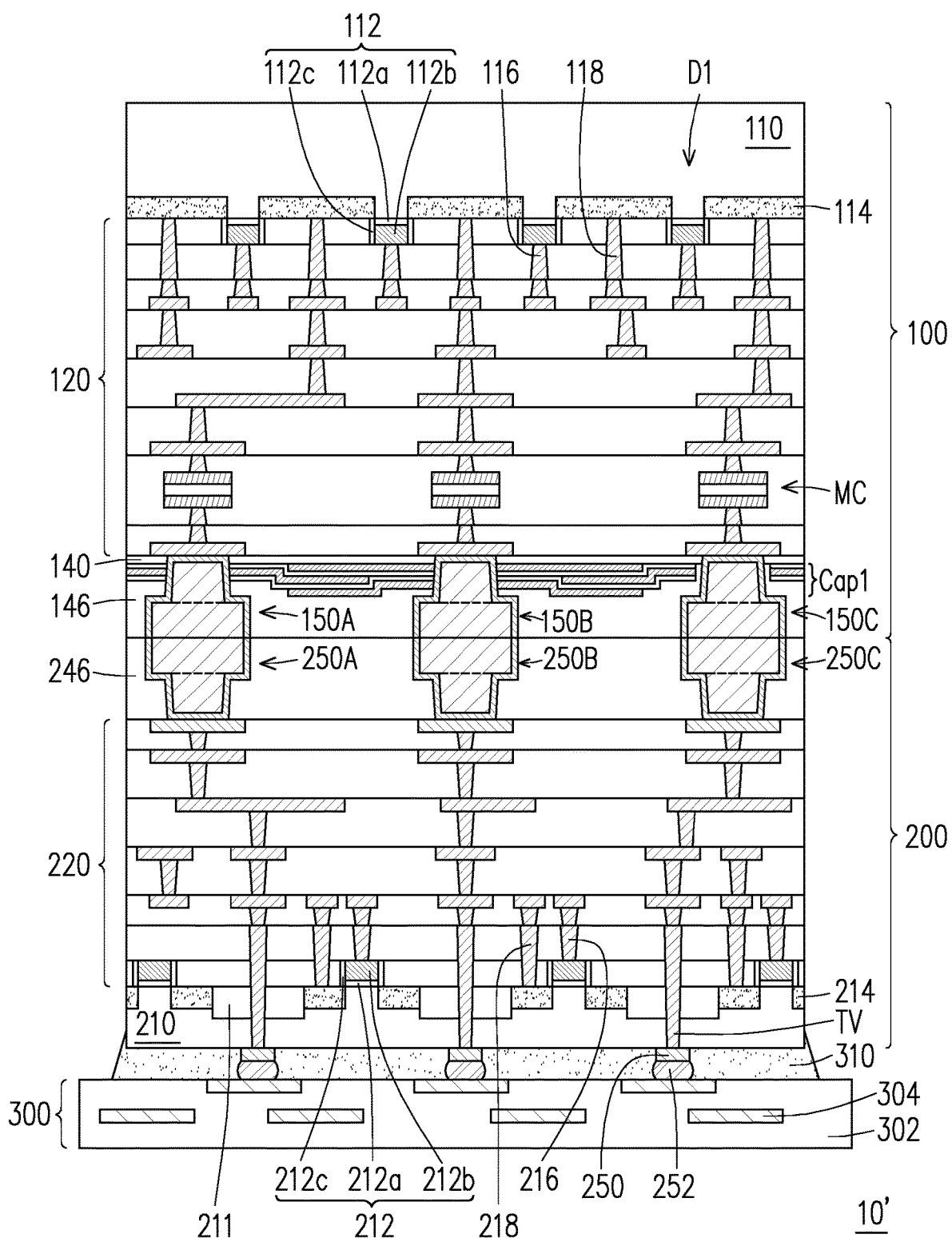
FIG. 4 is a schematic cross sectional view of a semiconductor package according to some embodiments.
Figure 5:
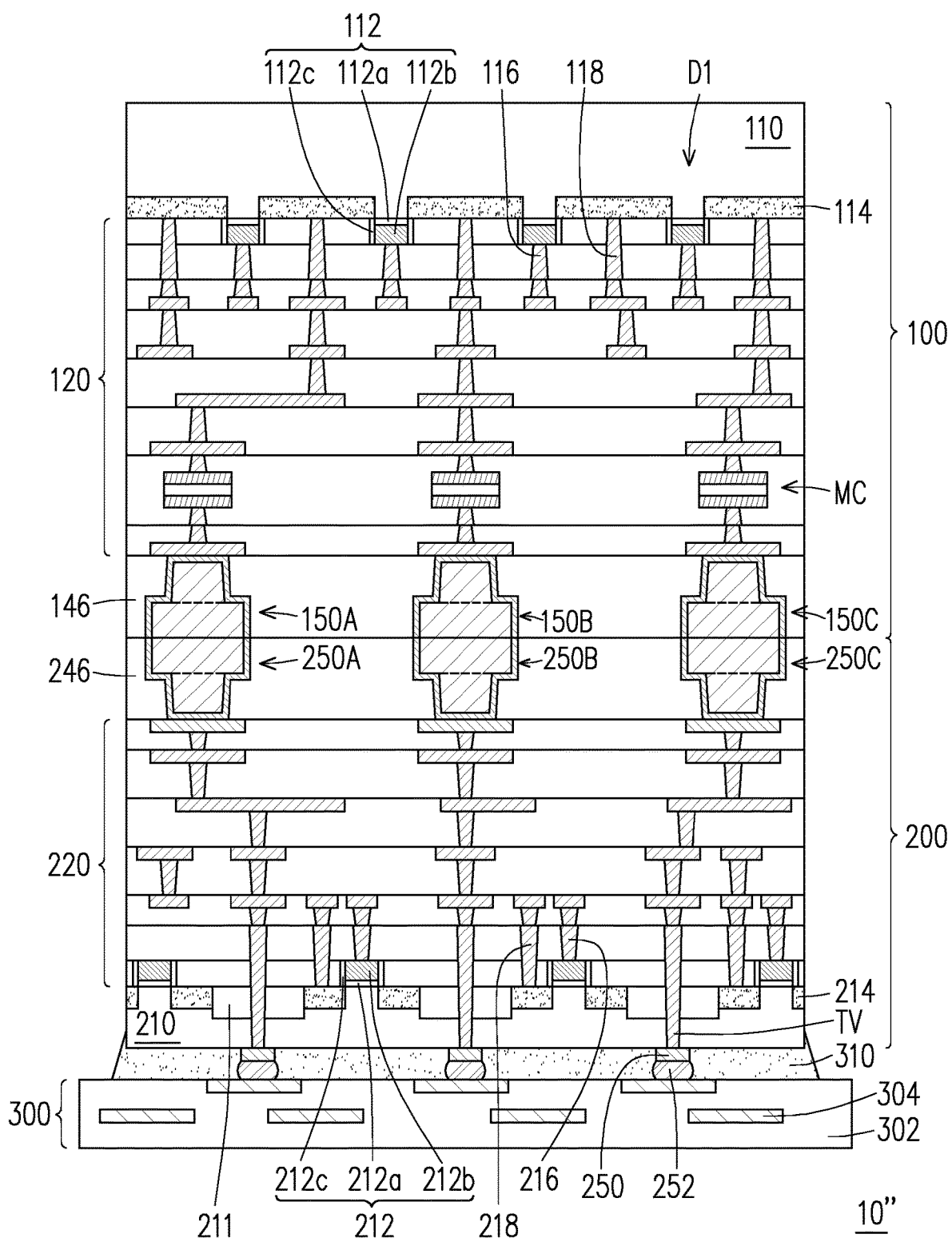
FIG. 5 is a schematic cross sectional view of a semiconductor package according to some embodiments.

In some embodiments, the memory die 100 and the peripheral circuit die 200 are both formed with the capacitor structures Cap1, Cap2. Thus, the capacitor structures Cap1, Cap2 may avoid current resistance drop, voltage fluctuation and noise on the power supply network of the circuit structure 300. In addition, in the case in which the memory cells MC are MRAM cells, the conductive layers 142, 242 of the capacitor structures Cap1, Cap2 include ferromagnetic elements and substantially entirely overlapped with the memory cells MC, and thus the conductive layers 142, 242 cooperatively function as a magnetic shielding layer for MRAM cells. However, the disclosure is not limited thereto. In alternative embodiments, at least one of the memory die 100 and the peripheral circuit die 200 is formed without the capacitor structures. For example, as shown in FIG. 4, in the semiconductor package 10', the capacitor structures Cap1 are merely formed in the memory die 100, and the peripheral circuit die 200 is formed without capacitor structures. In some alternative embodiments, as shown in FIG. 5, in the semiconductor package 10'', the memory die 100 and the peripheral circuit die 200 are formed without capacitor structures.

Figure 6:
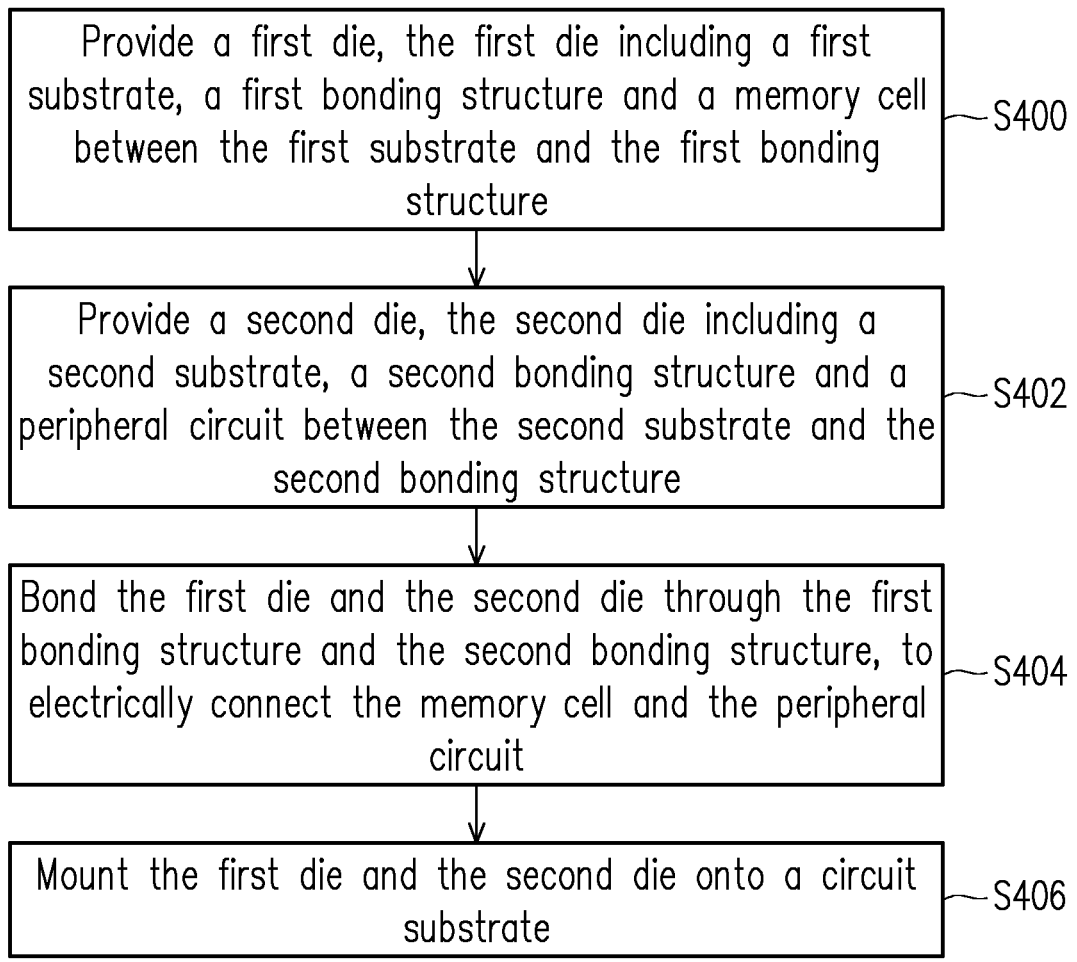
FIG. 6 illustrates a method of forming a semiconductor package in accordance with some embodiments.

FIG. 6 illustrates a method of forming a semiconductor package in accordance with some embodiments. Although the method is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act S400, a first die is provided, and the first die includes a first substrate, a first bonding structure and a memory cell between the first substrate and the first bonding structure. FIG. 1A to FIG. 1F, FIG. 4 and FIG. 5 illustrate varying views corresponding to some embodiments of act S400.

At act S402, a second die is provided, and the second die includes a second substrate, a second bonding structure and a peripheral circuit between the second substrate and the second bonding structure. FIG. 2A to FIG. 2D, FIG. 4 and FIG. 5 illustrate varying views corresponding to some embodiments of act S402.

At act S404, the first die and the second die are bonded through the first bonding structure and the second bonding structure, to electrically connect the memory cell and the peripheral circuit. FIG. 3A, FIG. 4 and FIG. 5 illustrate varying views corresponding to some embodiments of act S404.

At act S406, the first die and the second die are mounted onto a circuit structure. FIG. 3B, FIG. 4 and FIG. 5 illustrate varying views corresponding to some embodiments of act S406.

In some embodiments, the memory die including the memory cells such as MRAM cells and the peripheral circuit die including the peripheral circuit for the memory cells are vertically stacked. Thus, the footprint of the stacked memory die and peripheral circuit die may be substantially equal to the individual footprint of the memory die. In other words, compared to the conventional peripheral circuit surrounding the memory cells horizontally, a total footprint of the stacked memory die and peripheral circuit die may be reduced. In addition, a size of the peripheral circuit die may be enlarged as the memory die. Accordingly, the conductive line of the peripheral circuit die may have a larger pitch and/or a lager process window, and the peripheral circuit die may be robust, cheap and/or and highly reliable. Thus, the tunneling magnetoresistance value ("TMR") of the memory die is improved. In addition, the memory die and the peripheral circuit die are formed separately and then combined by bonding. Therefore, the memory die and the peripheral circuit die may be formed under different process condition such as process temperature, and one would not have an impact on the other. For example, the memory die without the peripheral circuit is fabricated under a relative high temperature such as 550° C. which may have impact on the peripheral circuit of the peripheral circuit die, however, the impact is prevented since the memory die and the peripheral circuit die are formed separately. Accordingly, the memory and the circuit may be formed under the desired condition thereof, and the performance of the formed memory device is improved. In some embodiments in which the memory cells are MRAM cells, the conductive layers of the capacitor structures and/or the liners of the bonding structures cooperatively function as a magnetic shielding layer.

In accordance with some embodiments of the disclosure, a semiconductor package includes a first semiconductor device and a second semiconductor device. The first semiconductor device includes a first semiconductor substrate, a first bonding structure and a memory cell. The second semiconductor device is stacked over the first semiconductor device. The second semiconductor device includes a second semiconductor substrate, a second bonding structure in a second dielectric layer and a peripheral circuit between the second semiconductor substrate and the second bonding structure. The first bonding structure and the second bonding structure are bonded and disposed between the memory cell and the peripheral circuit, and the memory cell and the peripheral circuit are electrically connected through the first bonding structure and the second bonding structure.

In accordance with some embodiments of the disclosure, a semiconductor package includes a first die and a second die. The first die includes a memory cell, a first bonding structure and a first capacitor structure. The first bonding structure is disposed over and electrically connected to the memory cell. The first capacitor structure is disposed aside the first bonding structure and includes a plurality of first conductive layers and a plurality of first dielectric layers. The first bonding structure is electrically connected to at least one of the first conductive layers, and the at least one of the first conductive layers comprises ferromagnetic material. The second die is bonded to the first die. The second die includes a peripheral circuit and a second bonding structure. The memory cell is electrically connected to the peripheral circuit through the first bonding structure and the second bonding structure.

In accordance with some embodiments of the disclosure, a method of forming a semiconductor package includes the following steps. An encapsulant is formed to encapsulate a first integrated circuit, and the first integrated circuit includes a first thermal pattern. A first passivation material is formed over the encapsulant and the first integrated circuit, and the first passivation material includes at least one first opening to expose the first thermal pattern. A first planarization process is performed on the first passivation material including the at least one first opening, to form a first passivation layer. A second thermal pattern is formed in the at least one first opening of the first passivation layer. A second passivation material is formed, and the second passivation material includes at least one second opening to expose the second thermal pattern. A second planarization process is performed on the second passivation material, to form a second passivation layer. An adhesive layer is formed over the second passivation layer and fills up the at least one second opening. A second integrated circuit is adhered over the first integrated circuit through the adhesive layer.

In accordance with some embodiments of the disclosure, a semiconductor package includes a first integrated circuit and a second integrated circuit. The first integrated circuit includes a first semiconductor substrate, a first bonding structure bonded to the second integrated circuit, a ferromagnetic layer surrounding the first bonding structure, and a memory cell between the first semiconductor substrate and the first bonding structure.

In accordance with some embodiments of the disclosure, a semiconductor package includes a first integrated circuit and a second integrated circuit. The first integrated circuit includes a first bonding structure and a memory cell. The second integrated circuit is stacked over the first integrated circuit and includes a semiconductor substrate, a second bonding structure bonded to the first bonding structure, a peripheral circuit between the semiconductor substrate and the second bonding structure and a plurality of through vias penetrating the semiconductor substrate. The plurality of through vias and the second bonding structure are disposed at opposite sides of the peripheral circuit.

In accordance with some embodiments of the disclosure, a semiconductor package includes a first integrated circuit and a second integrated circuit. The first integrated circuit includes a memory cell, a first bonding structure disposed over and electrically connected to the memory cell and a first capacitor structure disposed aside the first bonding structure. The first capacitor structure includes a plurality of first conductive layers, wherein the first bonding structure is electrically connected to at least one of the first conductive layers. The second integrated circuit is bonded to the first integrated circuit through the first bonding structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
  a first integrated circuit and a second integrated circuit, wherein the first integrated circuit comprises:
    a first semiconductor substrate;
    a first bonding structure bonded to the second integrated circuit;
    a ferromagnetic layer surrounding the first bonding structure; and
    a memory cell between the first semiconductor substrate and the first bonding structure.

2. The semiconductor package according to claim 1, wherein the ferromagnetic layer is in direct contact with the first bonding structure.

3. The semiconductor package according to claim 1, wherein the first bonding structure comprises a bonding pad and a bonding via, and the ferromagnetic layer surrounds sidewalls of the bonding pad and the bonding via.

4. The semiconductor package according to claim 3, wherein the bonding via has a first surface interfaced with the bonding pad and a second surface opposite to the first surface, and the ferromagnetic layer further surrounds the second surface of the bonding via.

5. The semiconductor package according to claim 1, further comprising at least one conductive layer and at least one dielectric layer between the ferromagnetic layer and the at least one conductive layer.

6. The semiconductor package according to claim 5, wherein the first bonding structure is disposed in the ferromagnetic layer, the at least one conductive layer and the at least one conductive layer.

7. A semiconductor package, comprising:
  a first integrated circuit, comprising a first bonding structure and a memory cell, wherein the memory cell is a MRAM cell; and
  a second integrated circuit stacked over the first integrated circuit, comprising:
    a semiconductor substrate;
    a second bonding structure bonded to the first bonding structure;
    a peripheral circuit between the semiconductor substrate and the second bonding structure; and
    a plurality of through vias penetrating the semiconductor substrate, wherein the plurality of through vias and the second bonding structure are disposed at opposite sides of the peripheral circuit.

8. The semiconductor package according to claim 7, wherein the first integrated circuit further comprises an interconnect structure, and the memory cell is disposed between the first bonding structure and the interconnect structure.

9. The semiconductor package according to claim 7, wherein the first bonding structure is in direct contact with the second bonding structure.

10. The semiconductor package according to claim 7, wherein the first integrated circuit further comprises a first active device electrically connected to the memory cell, the second integrated circuit further comprises a second active device electrically connected to the peripheral circuit, and the memory cell and the peripheral circuit are disposed between the first active device and the second active device.

11. The semiconductor package according to claim 7, wherein the first integrated circuit further comprises a first interconnect wiring and a second interconnect wiring stacked on one another, and the memory cell is disposed between and electrically connected to the first interconnect wiring and the second interconnect wiring.

12. A semiconductor package, comprising:
a first integrated circuit, comprising:
 a memory cell;
 a first bonding structure disposed over and electrically connected to the memory cell; and
 a first capacitor structure disposed aside the first bonding structure and comprising a plurality of first conductive layers, wherein the first bonding structure is electrically connected to at least one of the first conductive layers; and
a second integrated circuit bonded to the first integrated circuit through the first bonding structure.

13. The semiconductor package according to claim 12, wherein the at least one of the first conductive layers comprises ferromagnetic material.

14. The semiconductor package according to claim 12, wherein the second integrated circuit further comprises a peripheral circuit electrically connected to the memory cell.

15. The semiconductor package according to claim 12, wherein the first bonding structure is in direct contact with the at least one of the first conductive layers.

16. The semiconductor package according to claim 12, wherein the first bonding structure comprises ferromagnetic material.

17. The semiconductor package according to claim 12, wherein the first bonding structure comprises a bonding pad and a bonding via, and the bonding via is disposed in the at least one of the first conductive layers.

18. The semiconductor package according to claim 12, further comprising a liner surrounding the first bonding structure, wherein the liner comprises ferromagnetic material.

19. The semiconductor package according to claim 18, wherein a surface of the liner is substantially coplanar with a surface of the first bonding structure.

20. The semiconductor package according to claim 12, further comprising a dielectric layer surrounding the first bonding structure, wherein the dielectric layer covers the first capacitor structure and is in direct contact with the first capacitor structure.

* * * * *